(12) United States Patent
Zhang et al.

(10) Patent No.: US 9,026,876 B2
(45) Date of Patent: May 5, 2015

(54) PATTERN-DEPENDENT SHORT MEDIA DEFECT DETECTION

(71) Applicant: LSI Corporation, Milpitas, CA (US)

(72) Inventors: Fan Zhang, Milpitas, CA (US); Wu Chang, Sunnyvale, CA (US)

(73) Assignee: LSI Corporation, San Jose, CA (US)

( * ) Notice: Subject to any disclaimer, the term of this patent is extended or adjusted under 35 U.S.C. 154(b) by 87 days.

(21) Appl. No.: 13/631,075

(22) Filed: Sep. 28, 2012

(65) Prior Publication Data
US 2014/0095963 A1    Apr. 3, 2014

(51) Int. Cl.
*H03M 13/00* (2006.01)
*G06F 11/00* (2006.01)

(52) U.S. Cl.
CPC ..................... *G06F 11/00* (2013.01)

(58) Field of Classification Search
CPC ..................... H03M 13/2957; H03M 13/2975; H04L 1/0051
USPC ......... 714/704, 746, 753, 755, 794–795, 798; 375/341, 262
See application file for complete search history.

(56) References Cited

U.S. PATENT DOCUMENTS

2004/0153940 A1\* 8/2004 Yu et al. ..................... 714/746

\* cited by examiner

*Primary Examiner* — Guy Lamarre
(74) *Attorney, Agent, or Firm* — Suiter Swantz pc llo

(57) ABSTRACT

Systems and methods for computing sign disagreement between signals may implement one or more operations including, but not limited to: receiving an extrinsic log likelihood ratio (LLR) value; incrementing a sign-disagreement counter according to a sign disagreement between the extrinsic LLR value and an a priori LLR value; providing a value of the sign-disagreement counter to a binary short media defect (SMD) detector; and detecting one or more consecutive sign disagreements between an extrinsic output of a detector and an extrinsic output of a decoder.

20 Claims, 6 Drawing Sheets

402 receiving an extrinsic log likelihood ratio (LLR) value 404 incrementing a sign-disagreement counter according to a sign disagreement between the extrinsic LLR value and an *a priori* LLR value 406 providing a value of the sign-disagreement counter to a binary short media defect (SMD) detector

402 receiving an extrinsic log likelihood ratio (LLR) value

404 incrementing a sign-disagreement counter according to a sign disagreement between the extrinsic LLR value and an *a priori* LLR value > 502 determining if the extrinsic LLR value is at least one first extrinsic LLR or at least one second extrinsic LLR value
>
> 504 incrementing the sign-disagreement counter according to whether the extrinsic LLR value is the at least one first extrinsic LLR value or the at least one second extrinsic LLR value

406 providing a value of the sign-disagreement counter to a binary short media defect (SMD) detector

┌─────────────────────────────────────────────────────────────────┐
│ 402 receiving an extrinsic log likelihood ratio (LLR) value     │
└─────────────────────────────────────────────────────────────────┘
                                    │
┌─────────────────────────────────────────────────────────────────┐
│ 404 incrementing a sign-disagreement counter according to a sign│
│ disagreement between the extrinsic LLR value and an a priori LLR value │
│  ┌───────────────────────────────────────────────────────────┐  │
│  │ 502 determining if the extrinsic LLR value is at least one first extrinsic LLR │
│  │ or at least one second extrinsic LLR value                │  │
│  └───────────────────────────────────────────────────────────┘  │
│                                                                 │
│  ┌───────────────────────────────────────────────────────────┐  │
│  │ 504 incrementing the sign-disagreement counter according to whether the │
│  │ extrinsic LLR value is the at least one first extrinsic LLR value or the at least │
│  │ one second extrinsic LLR value                            │  │
│  │                                                           │  │
│  │ ┌─────────┐ ┌─────────┐ ┌─────────┐ ┌─────────┐           │  │
│  │ │ 602     │ │ 604     │ │ 606     │ │ 608     │           │  │
│  │ │ incre-  │ │ incre-  │ │ incre-  │ │ incre-  │           │  │
│  │ │ menting │ │ menting │ │ menting │ │ menting │           │  │
│  │ │ the sign-│ │ the sign-│ │ the sign-│ │ the sign-│      │  │
│  │ │ disagree-│ │ disagree-│ │ disagree-│ │ disagree-│      │  │
│  │ │ ment     │ │ ment     │ │ ment     │ │ ment     │      │  │
│  │ │ counter by 2 if:│ counter by 1 if:│ counter by 2 if:│ counter by 1 if:│ │
│  │ │ 1) the extrinsic│ 1) the extrinsic│ 1) the extrinsic│ 1) the extrinsic│ │
│  │ │ LLR value and │ LLR value and │ LLR value and │ LLR value and │ │
│  │ │ the a priori LLR│ the a priori LLR│ the a priori LLR│ the a priori LLR│ │
│  │ │ value have a 2-│ value have a 1-│ value have a 1-│ value have a 2-│ │
│  │ │ bit sign │ bit sign │ bit sign │ bit sign │                │  │
│  │ │ disagreement │ disagreement │ disagreement │ disagreement │    │  │
│  │ │ and; 2) the │ and; 2) the │ and; 2) the │ and; 2) the │          │  │
│  │ │ extrinsic LLR │ extrinsic LLR │ extrinsic LLR │ extrinsic LLR │ │
│  │ │ value is the at│ value is the at│ value is the at│ value is the at│ │
│  │ │ least one first│ least one first│ least one │ least one │        │  │
│  │ │ extrinsic LLR │ extrinsic LLR │ second │ second │                │  │
│  │ │ value │ value │ extrinsic LLR │ extrinsic LLR │                  │  │
│  │ │       │       │ value │ value │                                  │  │
│  │ └─────────┘ └─────────┘ └─────────┘ └─────────┘           │  │
│  └───────────────────────────────────────────────────────────┘  │
└─────────────────────────────────────────────────────────────────┘
                                    │
┌─────────────────────────────────────────────────────────────────┐
│ 406 providing a value of the sign-disagreement counter to a binary short media │
│ defect (SMD) detector                                           │
└─────────────────────────────────────────────────────────────────┘
```

FIG. 6

PATTERN-DEPENDENT SHORT MEDIA DEFECT DETECTION

BACKGROUND

Codecs may use non-binary short media defect (SMD) detection algorithms. The principle SMD detection is to detect consecutive sign-disagreements between an extrinsic output of a detector and decoder indicative of a media defect (e.g. a storage media defect).

An underlying assumption for such algorithms to work well is that the probability of two-bit sign disagreement (2SD) is higher than the probability of one-bit sign disagreement (1SD), and the probability of 1SD is higher than the probability of 0-bit sign disagreement (0SD) in the defect locations.

SUMMARY

The above assumption is not always valid in that the order of the probability of 2SD, 1SD and 0SD may be pattern-dependent. As described herein, a proposed pattern-dependent short media defect detection algorithm and the simulation results are also shown.

BRIEF DESCRIPTION OF DRAWINGS

The numerous advantages of the disclosure may be better understood by those skilled in the art by referencing the accompanying figures in which:

FIG. 4 shows a method for computing sign disagreement between Le and La signals;
FIG. 5 shows a method for computing sign disagreement between Le and La signals;
and
FIG. 6 shows a method for computing sign disagreement between Le and La signals.

DETAILED DESCRIPTION

Figure 1:
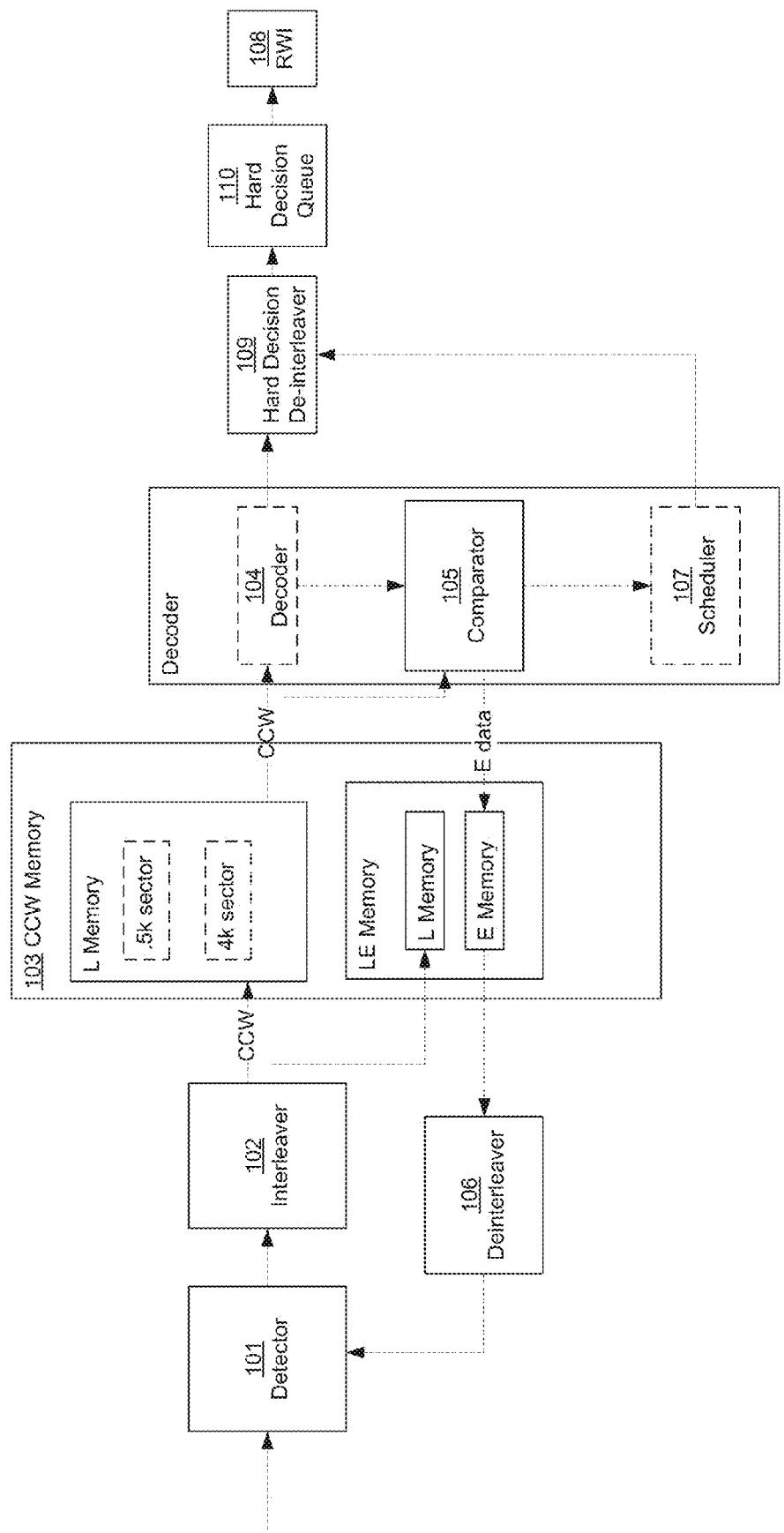
FIG. 1 shows a system for hard-decision decoding.

Referring to FIG. 1, a system 100 for hard-decision decoding is shown. The system 100 may receive input data from a source (i.e. a disk drive including a storage media) at a detector 101. The detector 101 may provide the input data to an interleaver 102. The interleaver 102 may interleave the input data according to a given interleaving scheme to form at least one soft-decision component codeword (CCW) which may be stored to a CCW memory 103.

The CCW memory 103 may include an LLR memory partition 103-1 and an LLR-E memory partition 103-2. The LLR memory partition 103-1 may store at least one CCW including log likelihood ratio data (LLR data) received from the interleaver.

Following storage of at least one CCW to the LLR memory partition 103-1, the CCW may be provided to a decoder 104. The decoder 104 may decode the CCW according to a decoding scheme (e.g. a low-density priority check (LDPC) decoding scheme) and determine a convergence of the CCW (e.g. by comparison of a decoder converge signal to a threshold convergence value). Detection of a convergence of the CCW may be indicative that the "hard" decision component of a "soft" decision CCW has been likely been correctly determined and may be suitable for computations by a read/write interface 105 (RWI).

Specifically, if a decoder converge signal is high, it may be indicative that a current CCW has converged. If one or more CCWs have not converged, extrinsic data (E data) (i.e. error in the output of the decoder 104 minus error in the input data) may be employed to facilitate convergence.

The E data may be provided to a local de-interleaver 106 that may interleave the E data according to the given interleaving scheme. The de-interleaved E data may be provided to the detector 101 thereby by completing a first convergence iteration for the CCW. The system 100 may carry out additional convergence operations as described above with respect to the E data until the E data reaches a given convergence threshold or the system 100 completes a threshold number of convergence iterations as determined by a scheduler 107. Detection of a convergence of the CCW may be indicative that the "hard" decision component of a "soft" decision CCW has been likely been correctly determined and may be suitable for computations by a read/write interface 108 (RWI).

Upon reaching the convergence threshold or the iteration threshold maintained by the scheduler 107, the scheduler 107 may signal a hard-decision de-interleaver 109 (HDDLV) to query the decoder 104 to obtain the decoded CCW. Upon receipt of such a signal, the hard-decision de-interleaver 109 may de-interleave the decoded CCW according to the given interleaving scheme and provide the de-interleaved decoded CCW to a hard-decision queue 110 (HDQ). Once all CCW of a given data sector have converged to a likely "hard" decision value and been stored to the hard-decision queue 110, the hard-decision queue 110 may provide the data sector to the read/write interface 108 for further processing.

Figure 2:
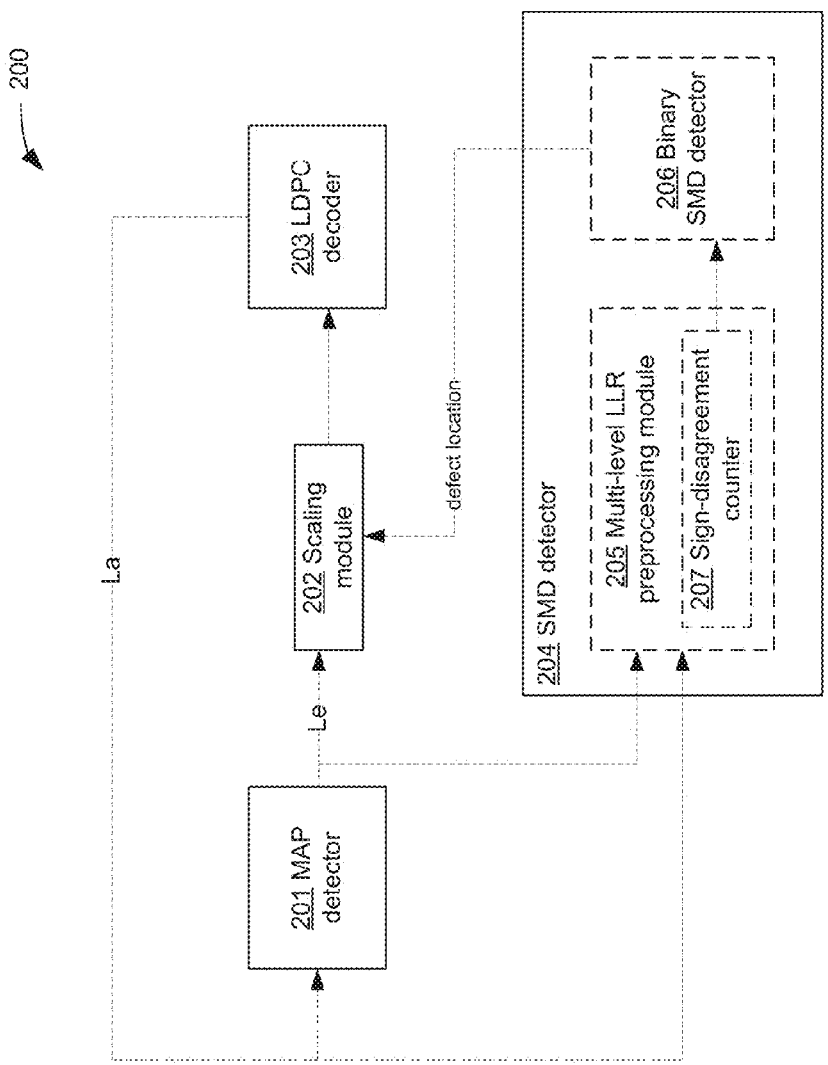
FIG. 2 shows an LDPC codec.

FIG. 2 illustrates an LDPC codec 200. The LDPC codec 200 may include a max a posteriori (MAP) detector 201, a scaling module 202, an LDPC decoder 203 and an SMD detector 204. The SMD detector 204 may include a multi-level LLR preprocessing module 205 and a binary SMD detector 206. The MAP detector 201 and the SMD detector 204 may receive as an input a CCW including a priori LLR data (i.e. the "La" signal of FIG. 2). After decoding of the La signal by the MAP detector 201, extrinsic LLR data (i.e. the "Le" signal of FIG. 2) may be provided to the scaling module 202 and the SMD detector 204. The scaling module 202 may scale down the input to the LDPC decoder 203 by a factor of 0.75.

Figure 3:
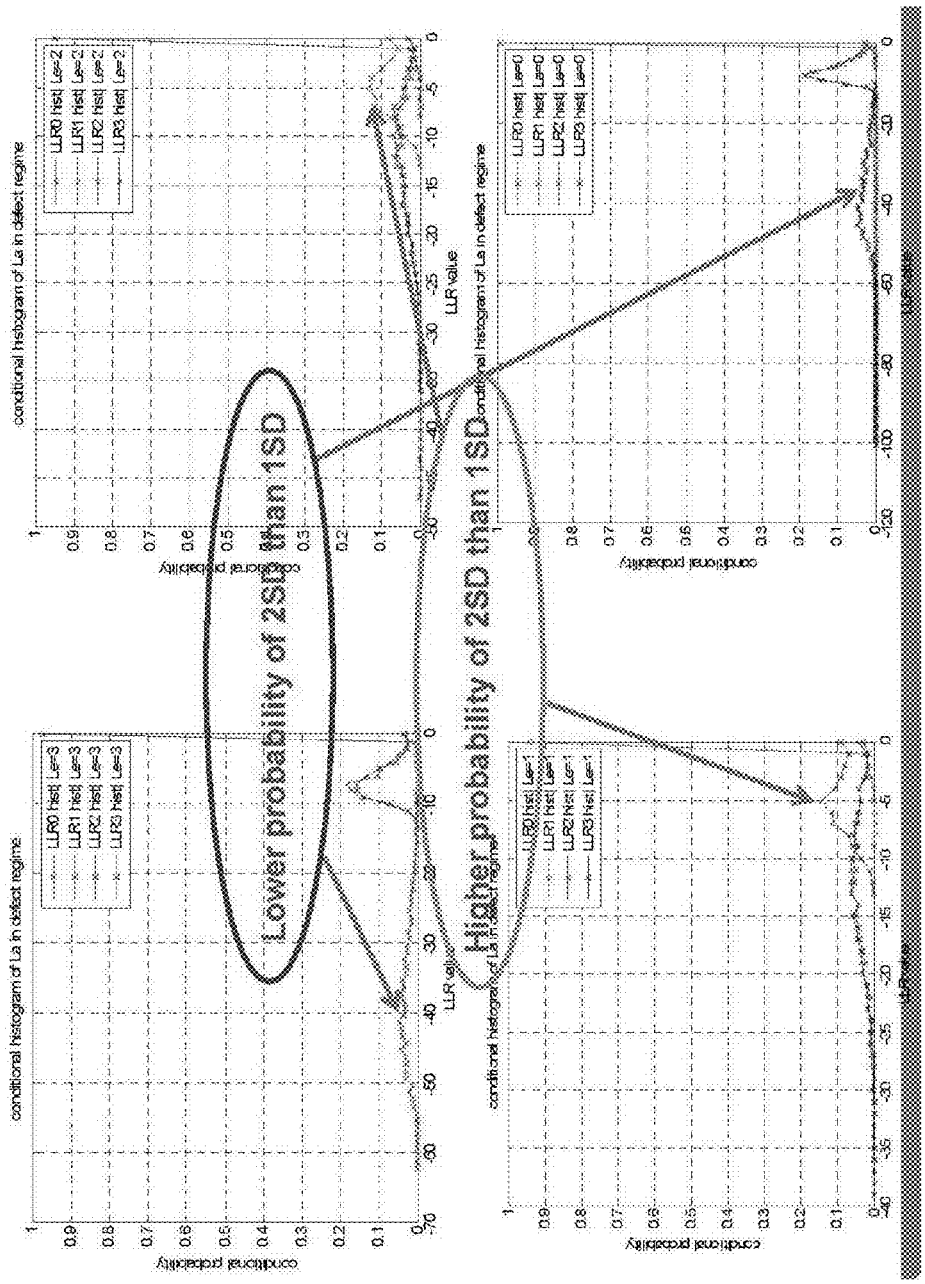
FIG. 3 shows conditional LLR histograms of an La signal.

Referring to FIG. 3, conditional LLR histograms of the La signal are shown. Conditional (i.e. on the hard decision of Le) LLR distributions for LLR0, LLR1, LLR2 and LLR3 for the La signal at the MAP detector 201 are shown. As can be seen, for an Le of 0 and 3, LLR0-LLR3 exhibit lower probability of 2SD than 1SD. Further, for an Le of 1 or 2, LLR0-LLR3 exhibit a higher probability of 2SD than 1SD.

As shown in FIG. 3, depending on the hard decision of Le, there may be a higher probability of seeing 2SD than 1SD. This may be explained as follows. It may be the case that the channel may have jitter-dominant noise. A typical error event may be a 1-bit phase shift of a sequence of Nyquist transition patterns. This may indicate that a ysample (i.e. an equalized analog-to-digital conversion signal provided to a backend detector) of no phase shift has a similar metric in a detector to a 1-bit phase-shift ysample. This may cause higher probability of 2-bit error than 1-bit error if transition occurs.

In the case of LLR0 and LLR3, no transition occurs. However, in the case of LLR1 and LLR2, transition may occur resulting in the higher probability of 2-bit error than 1-bit error in such cases.

It may be the case that the output Le signal from the MAP detector 201 may have a high probability of being correct while the output La signal of the LDPC decoder 203 is affected by the ysample and, therefore, has a higher probability of 2-bit flip than 1-bit flip when Le is 1 or 2 and has a higher probability of 1-bit flip than 2-bit flip when Le is 0 or 3.

Based on the above knowledge, the SMD detector 204 may include the multi-level LLR preprocessing module 205 configured to account for the system behavior according to the Le value.

The preprocessing module 205 may implement one or more operations for computing sign disagreement as shown in operational flow 400 of FIG. 4. Discussion and explanation of the operations of may be provided with respect to the examples of FIGS. 1 and 2, and/or with respect to other examples and contexts. However, it should be understood that the operational flows may be executed in a number of other environments and contexts, and/or in modified versions of FIG. 1. In addition, although the various operational flows are presented in the sequence(s) illustrated, it should be understood that the various operations may be performed in other orders than those that are illustrated, or may be performed concurrently.

Operation 402 illustrates receiving an extrinsic log likelihood ratio (LLR) value. For example, as shown in FIG. 2, the MAP detector 201 may generate an Le signal which may be received by the SMD detector 204 where it is passed to the preprocessing module 205.

Operation 404 illustrates incrementing a sign-disagreement counter according to a sign disagreement between the extrinsic LLR value and an a priori LLR value. For example, the preprocessing module 205 of the SMD detector 204 may maintain a sign-disagreement counter 207. The preprocessing module 205 may determine if a sign-disagreement exists between the La signal and the Le signal. Upon a detection of such a sign-disagreement between the Le and La signals, the sign-disagreement counter 207 may be incremented. If no sign-disagreement is detected between the Le and the La signal, no incrementing of the sign-disagreement counter 207 may occur.

Operation 404 illustrates providing a value of the sign-disagreement counter to a binary short media defect (SMD) detector. For example, as shown in FIG. 2, following the determination of the sign-disagreement count by the preprocessing module 205, the value in the sign-disagreement counter 207 may be provided to the binary SMD detector 206. In this way, the binary SMD detector 206 may detect consecutive sign-disagreements between an extrinsic output of the MAP detector 201 and the LDPC decoder 203 indicative of a high-probability of a media defect.

In other embodiments, the operations of operational flow 400 of FIG. 4 may include one or more additional operations. For example, as shown in FIG. 5, operation 404 may include at least one additional operation such as operations 502 and/or 504.

Operation 502 illustrates determining if the extrinsic LLR value is at least one first extrinsic LLR value or at least one second extrinsic LLR value. For example, as noted above with respect to FIG. 3, there may be a higher probability of seeing 2SD than 1 SD depending on the hard decision of Le. As can be seen, for an Le of 0 and 3, LLR0-LLR3 exhibit lower probability of 2SD than 1SD. Further, for an Le of 1 or 2, LLR0-LLR3 exhibit a higher probability of 2SD than 1SD. As such, the preprocessing module 205 may determine if the Le is at least one first value (i.e. 0 or 3) or if the Le is at least one second value (i.e. 1 or 2).

Operation 504 illustrates incrementing the sign-disagreement counter according to whether the extrinsic LLR value is the at least one first extrinsic LLR value or the at least one second extrinsic LLR value. For example, as shown in FIG. 2, depending on the value of the Le signal (i.e. whether the Le signal is 0/3 or 1/2), the preprocessing module 205 may increment the sign-disagreement counter 207 differently for a given sign-disagreement between the Le signal and the La signal.

In other embodiments, the operations of operational flow 400 of FIG. 4 may include one or more additional operations. For example, as shown in FIG. 6, operation 504 of FIG. 5 may include one or more additional operations such as operations 602 604, 606 and/or 608.

Operation 602 illustrates incrementing the sign-disagreement counter by 2 if: 1) the extrinsic LLR value and the a priori LLR value have a 2-bit sign disagreement and; 2) the extrinsic LLR value is the at least one first extrinsic LLR value. For example, as shown in FIG. 2, if the Le and La signals have 2-bit sign disagreement and the Le signal has a value of 0 or 3, the sign-disagreement counter 207 may be incremented by 2.

Operation 604 illustrates incrementing the sign-disagreement counter by 1 if: 1) the extrinsic LLR value and the a priori LLR value have a 1-bit sign disagreement and; 2) the extrinsic LLR value is the at least one first extrinsic LLR value. For example, as shown in FIG. 2, if the Le and La signals have 1-bit sign disagreement and the Le signal has a value of 0 or 3, the sign-disagreement counter 207 may be incremented by 1.

Operation 606 illustrates incrementing the sign-disagreement counter by 2 if: 1) the extrinsic LLR value and the a priori LLR value have a 1-bit sign disagreement and; 2) the extrinsic LLR value is the at least one second extrinsic LLR value. For example, as shown in FIG. 2, if the Le and La signals have 1-bit sign disagreement and the Le signal has a value of 1 or 2, the sign-disagreement counter 207 may be incremented by 2.

Operation 608 illustrates incrementing the sign-disagreement counter by 1 if: 1) the extrinsic LLR value and the a priori LLR value have a 2-bit sign disagreement and; 2) the extrinsic LLR value is the at least one second extrinsic LLR value. For example, as shown in FIG. 2, if the Le and La signals have 2-bit sign disagreement and the Le signal has a value of 1 or 2, the sign-disagreement counter 207 may be incremented by 1.

It is believed that the present invention and many of its attendant advantages will be understood by the foregoing description. It may be also believed that it will be apparent that various changes may be made in the form, construction and arrangement of the components thereof without departing from the scope and spirit of the invention or without sacrificing all of its material advantages. The form herein before described being merely an explanatory embodiment thereof. It may be the intention of the following claims to encompass and include such changes.

The foregoing detailed description may include set forth various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples may be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, may be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure.

In addition, those skilled in the art will appreciate that the mechanisms of the subject matter described herein may be capable of being distributed as a program product in a variety of forms, and that an illustrative embodiment of the subject matter described herein applies regardless of the particular type of signal bearing medium used to actually carry out the distribution. Examples of a signal bearing medium include, but may be not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link (e.g., transmitter, receiver, transmission logic, reception logic, etc.), etc.).

Those having skill in the art will recognize that the state of the art has progressed to the point where there may be little distinction left between hardware, software, and/or firmware implementations of aspects of systems; the use of hardware, software, and/or firmware may be generally (but not always, in that in certain contexts the choice between hardware and software may become significant) a design choice representing cost vs. efficiency tradeoffs. Those having skill in the art will appreciate that there may be various vehicles by which processes and/or systems and/or other technologies described herein may be effected (e.g., hardware, software, and/or firmware), and that the preferred vehicle will vary with the context in which the processes and/or systems and/or other technologies may be deployed. For example, if an implementer determines that speed and accuracy may be paramount, the implementer may opt for a mainly hardware and/or firmware vehicle; alternatively, if flexibility may be paramount, the implementer may opt for a mainly software implementation; or, yet again alternatively, the implementer may opt for some combination of hardware, software, and/or firmware. Hence, there may be several possible vehicles by which the processes and/or devices and/or other technologies described herein may be effected, none of which may be inherently superior to the other in that any vehicle to be utilized may be a choice dependent upon the context in which the vehicle will be deployed and the specific concerns (e.g., speed, flexibility, or predictability) of the implementer, any of which may vary. Those skilled in the art will recognize that optical aspects of implementations will typically employ optically oriented hardware, software, and or firmware.

What is claimed is:

1. A computer-implemented method comprising:
receiving an extrinsic log likelihood ratio (LLR) value;
incrementing a sign-disagreement counter according to a sign disagreement between the extrinsic LLR value and an a priori LLR value;
providing a value of the sign-disagreement counter to a binary short media defect (SMD) detector; and
detecting one or more consecutive sign disagreements between an extrinsic output of a detector and an extrinsic output of a decoder.

2. The method of claim 1, wherein the incrementing a sign-disagreement counter according to a sign disagreement between the extrinsic LLR value and an a priori LLR value comprises:
determining if the extrinsic LLR value is at least one first extrinsic LLR value or at least one second extrinsic LLR value; and
incrementing the sign-disagreement counter according to whether the extrinsic LLR value is the at least one first extrinsic LLR value or the at least one second extrinsic LLR value.

3. The method of claim 2, wherein the determining if the extrinsic LLR value is at least one first extrinsic LLR value or at least one second extrinsic LLR value comprises:
wherein the at least one first extrinsic LLR value is 0 or 3; and
wherein the at least one second extrinsic LLR value is 1 or 2.

4. The method of claim 2, wherein the incrementing the sign-disagreement counter according to whether the extrinsic LLR value is the at least one first extrinsic LLR value or the at least one second extrinsic LLR value comprises:
incrementing the sign-disagreement counter by 2 if: 1) the extrinsic LLR value and the a priori LLR value have a 2-bit sign disagreement and; 2) the extrinsic LLR value is the at least one first extrinsic LLR value;
incrementing the sign-disagreement counter by 1 if: 1) the extrinsic LLR value and the a priori LLR value have a 1-bit sign disagreement and; 2) the extrinsic LLR value is the at least one first extrinsic LLR value;
incrementing the sign-disagreement counter by 2 if: 1) the extrinsic LLR value and the a priori LLR value have a 1-bit sign disagreement and; 2) the extrinsic LLR value is the at least one second extrinsic LLR value; and
incrementing the sign-disagreement counter by 1 if: 1) the extrinsic LLR value and the a priori LLR value have a 2-bit sign disagreement and; 2) the extrinsic LLR value is the at least one second extrinsic LLR value.

5. The method of claim 1, wherein the extrinsic LLR value is an output from a max a posteriori detector.

6. The method of claim 1, wherein the a priori LLR value is an output from a low-density priority check (LDPC) decoder.

7. The method of claim 1, further comprising:
scaling the extrinsic LLR value.

8. A system comprising:
at least one computing device; and
one or more instructions that, when executed by the at least one computing device, configure the at least one computing device for:
receiving an extrinsic log likelihood ratio (LLR) value;
incrementing a sign-disagreement counter according to a sign disagreement between the extrinsic LLR value and an a priori LLR value; and
providing a value of the sign-disagreement counter to a binary short media defect (SMD) detector; and
detecting one or more consecutive sign disagreements between an extrinsic output of a detector and an extrinsic output of a decoder.

9. The system of claim 8, wherein the incrementing a sign-disagreement counter according to a sign disagreement between the extrinsic LLR value and an a priori LLR value comprises:
determining if the extrinsic LLR value is at least one first extrinsic LLR value or at least one second extrinsic LLR value; and incrementing the sign-disagreement counter according to whether the extrinsic LLR value is the at least one first extrinsic LLR value or the at least one second extrinsic LLR value.

10. The system of claim 9,
wherein the at least one first extrinsic LLR value is 0 or 3; and
wherein the at least one second extrinsic LLR value is 1 or 2.

11. The system of claim 9, wherein the incrementing the sign-disagreement counter according to whether the extrinsic LLR value is the at least one first extrinsic LLR value or the at least one second extrinsic LLR value comprises:
  incrementing the sign-disagreement counter by 2 if: 1) the extrinsic LLR value and the a priori LLR value have a 2-bit sign disagreement and; 2) the extrinsic LLR value is the at least one first extrinsic LLR value;
  incrementing the sign-disagreement counter by 1 if: 1) the extrinsic LLR value and the a priori LLR value have a 1-bit sign disagreement and; 2) the extrinsic LLR value is the at least one first extrinsic LLR value;
  incrementing the sign-disagreement counter by 2 if: 1) the extrinsic LLR value and the a priori LLR value have a 1-bit sign disagreement and; 2) the extrinsic LLR value is the at least one second extrinsic LLR value; and
  incrementing the sign-disagreement counter by 1 if: 1) the extrinsic LLR value and the a priori LLR value have a 2-bit sign disagreement and; 2) the extrinsic LLR value is the at least one second extrinsic LLR value.

12. The system of claim 8, wherein the extrinsic LLR value is an output from a max a posteriori detector.

13. The system of claim 8, wherein the a priori LLR value is an output from a low-density priority check (LDPC) decoder.

14. The method of claim 8, further comprising:
  scaling the extrinsic LLR value.

15. A non-transitory computer readable medium tangibly embodying one or more computer readable instructions for:
  receiving an extrinsic log likelihood ratio (LLR) value;
  incrementing a sign-disagreement counter according to a sign disagreement between the extrinsic LLR value and an a priori LLR value; and
  providing a value of the sign-disagreement counter to a binary short media defect (SMD) detector; and
  detecting one or more consecutive sign disagreements between an extrinsic output of a detector and an extrinsic output of a decoder.

16. The computer readable of claim 15, wherein the incrementing a sign-disagreement counter according to a sign disagreement between the extrinsic LLR value and an a priori LLR value comprises:
  incrementing the sign-disagreement counter according to whether the extrinsic LLR value is the at least one first extrinsic LLR value or the at least one second extrinsic LLR value.

17. The computer readable of claim 16,
wherein the at least one first extrinsic LLR value is 0 or 3; and
wherein the at least one second extrinsic LLR value is 1 or 2.

18. The computer readable of claim 16, wherein the incrementing the sign-disagreement counter according to whether the extrinsic LLR value is the at least one first extrinsic LLR value or the at least one second extrinsic LLR value comprises:
  incrementing the sign-disagreement counter by 2 if: 1) the extrinsic LLR value and the a priori LLR value have a 2-bit sign disagreement and; 2) the extrinsic LLR value is the at least one first extrinsic LLR value;
  incrementing the sign-disagreement counter by 1 if: 1) the extrinsic LLR value and the a priori LLR value have a 1-bit sign disagreement and; 2) the extrinsic LLR value is the at least one first extrinsic LLR value;
  incrementing the sign-disagreement counter by 2 if: 1) the extrinsic LLR value and the a priori LLR value have a 1-bit sign disagreement and; 2) the extrinsic LLR value is the at least one second extrinsic LLR value; and
  incrementing the sign-disagreement counter by 1 if: 1) the extrinsic LLR value and the a priori LLR value have a 2-bit sign disagreement and; 2) the extrinsic LLR value is the at least one second extrinsic LLR value.

19. The non-transitory computer readable medium of claim 15, wherein the extrinsic LLR value is an output from a max a posteriori detector.

20. The non-transitory computer readable medium of claim 15, wherein the a priori LLR value is an output from a low-density priority check (LDPC) decoder.

* * * * *